United States Patent [19]

Carralero et al.

[11] Patent Number: 5,216,389
[45] Date of Patent: Jun. 1, 1993

[54] TEMPERATURE COMPENSATION OF A CRYSTAL REFERENCE USING DIRECT DIGITAL SYNTHESIS

[75] Inventors: Cesar W. Carralero; Jaime A. Borras, both of Hialeah; Armando J. Gonzalez, Miami, all of Fla.

[73] Assignee: Motorola, Inc., Schaumburg, Ill.

[21] Appl. No.: 828,829

[22] Filed: Jan. 31, 1992

[51] Int. Cl.⁵ .................. H03L 1/02; H03L 7/06
[52] U.S. Cl. ............................ 331/18; 331/25; 331/158; 331/176
[58] Field of Search ........... 331/116 R, 116 FE, 158, 331/176, 18, 25

[56] References Cited

U.S. PATENT DOCUMENTS

| | | | |
|---|---|---|---|
| 4,427,952 | 1/1984 | Zumsteg | 331/176 |
| 4,454,483 | 6/1984 | Baylor | 331/176 X |
| 4,905,177 | 2/1990 | Weaver, Jr. et al. | 364/721 |
| 4,965,533 | 10/1990 | Gilmore | 331/18 |
| 4,967,165 | 10/1990 | Lee et al. | 331/66 |
| 5,041,799 | 8/1991 | Pirez | 331/44 |

OTHER PUBLICATIONS

"Q2334 Dual Direct Digital Synthesizer, Technical Data Sheet" by Qualcomm Inc., Jun. 1991 pp. 1-35.

Primary Examiner—Siegfried H. Grimm
Attorney, Agent, or Firm—Pedro P. Hernandez

[57] ABSTRACT

Certain operational characteristics of a crystal (104) are measured during a testing and grading process. Once determined, information representing these operational characteristics are stored in memory (120) and utilized by a controller (122) to increment a phase increment register (114) upon determining the crystals ambient temperature via a temperature sensing circuit (124). The value stored in the phase increment register (114) is then sent to a phase accumulator (116) where successive phase increments are summed together. This summed value is in turn sent to a sine lookup table (118) where the instantaneous phase value is converted into sine amplitude. Finally, a digital to analog converter (126) converts the amplitude bit stream into an analog signal for use as a reference oscillator frequency having extremely high frequency resolution. The above mentioned process is repeated every clock cycle until a complete sine wave is produced at which point the phase accumulator is reset to zero and the process begins again.

15 Claims, 2 Drawing Sheets

TEMPERATURE COMPENSATION OF A CRYSTAL REFERENCE USING DIRECT DIGITAL SYNTHESIS

TECHNICAL FIELD

This invention relates generally to temperature compensation circuits, and more specifically to a crystal reference temperature compensation circuit.

BACKGROUND

Crystal oscillator circuits vary in output frequency due to variations in the resonant frequency of the circuit's crystal reference element. These variations to the crystal element are typically caused by changes in temperature which affect the crystal elements resonant frequency. A few techniques which are used in the art for compensating for these crystal variations include: using crystals having good temperature characteristics; using crystal ovens to maintain the crystal's temperature at a substantially constant temperature; and characterizing the crystal over temperature and compensating for these characterized variations by providing a compensation signal to the oscillator circuit which attempts to offset the variations in the crystal, such as discussed in U.S. Pat. No. 4,967,165 by Lee et al.

The major problem with using high quality (e.g., minimal temperature variation crystals) crystals as described above is that high quality crystals tend to be very expensive and still tend to vary a substantial amount over temperature. The use of crystal ovens are not only expensive since they require quite a bit of parts to implement, but they also tend to be impractical for battery powered applications due to their high current drain. Known compensation techniques that compensate for characterized crystal variations do not provide the frequency stability required for modern communication equipment having high specifications.

Present day frequency synthesizers normally utilize varactors to vary the resonant frequency of the crystal oscillator in order to change the phase-locked-loop (PLL) output frequency. Voltage curves corresponding to different temperatures are also typically programmed over the operating temperature range of the synthesizer into the PLL. The programming, in turn, sets current sources which are enabled at certain temperatures and drive the oscillator varactor differently over temperature in order to compensate the circuit for changes in temperature. The problem with the above compensation scheme is that the synthesizer requires the use of a varactor to adjust the oscillator's frequency. The varactor not only adds additional cost to the circuit but also adds it's own tolerances to the final generated frequency.

A need thus exists in the art for a way of eliminating the use of tight temperature characteristic crystal elements and still be able to provide for a crystal oscillator circuit which exhibits extremely small output frequency variations over temperature. A need also exists for a way of eliminating the need for using varactors in the synthesizer's oscillator circuit as the circuit's tuning vehicle.

SUMMARY OF THE INVENTION

Briefly, according to the invention, a temperature compensated oscillator circuit comprises a reference oscillator circuit for generating a reference oscillator signal. A digital synthesizer means for receiving the reference oscillator signal and providing an output signal having a predetermined frequency. The temperature compensated circuit further including a compensation means for providing a compensation signal to the digital synthesizer means in order to maintain the output signal substantially at the predetermined frequency over a given temperature range. In another aspect of the invention, a radio comprises a receiver and a temperature compensated oscillator circuit.

DETAILED DESCRIPTION OF THE PREFERRED EMBODIMENT

Figure 1:
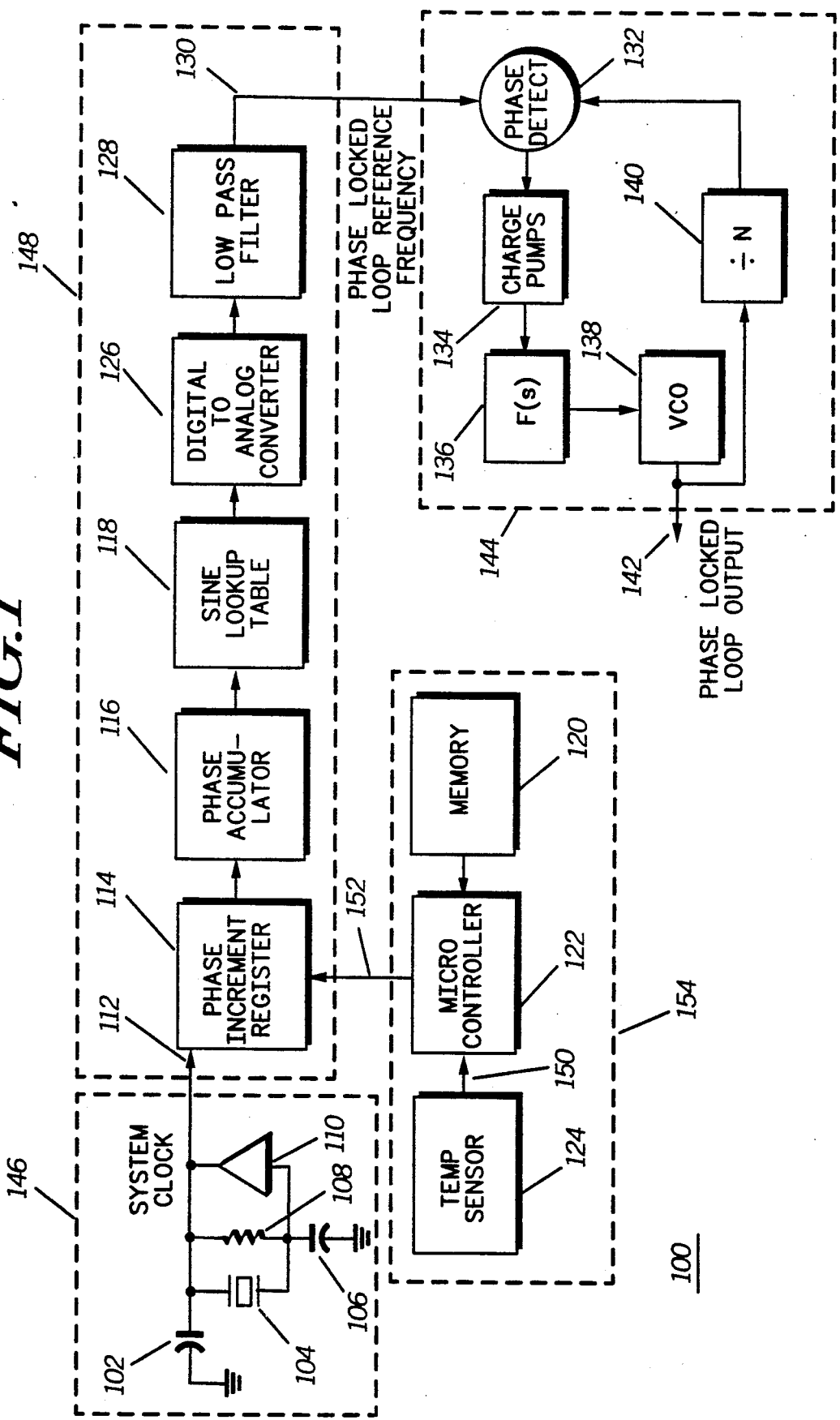
FIG. 1 is a block diagram of a reference oscillator crystal temperature compensation circuit utilizing direct digital synthesis with PLL synthesizer circuit in accordance with the present invention.

Referring now to the drawings and specifically to FIG. 1, there is shown a system block diagram of a PLL synthesizer 100 in accordance with the present invention. The invention utilizes a digital synthesizer means such as direct digital synthesizer (DDS) 148 and a conventional phase-lock-loop (PLL) synthesizer section 144 as known in the art. The DDS section 148 comprises a phase increment register 114, a phase accumulator 116, a sine look-up table 118, a digital to analog converter 126, and an anti-aliasing filter such as low-pass filter 128. The digital synthesizer 148 accumulates phase changes at a higher clock frequency and generates a lower frequency output signal. Sampling theory requires that the generated signal be no more than one-half of the reference clock input signal.

A typical oscillator circuit such as system clock circuit 146 comprises a crystal element 104, resistor 108, capacitors 102 and 106 and inverter 110 to provide a system clock signal 112 for the digital synthesizer. The problem with crystal references, such as crystal element 104, is that their resonant frequencies vary over temperature. The present invention compensates for these variations by utilizing a compensation means such as compensation section 154, which comprises a control means, such as microcontroller 122. Microcontroller 122 can be a microprocessor or microcontroller as known in the art. Also part of compensation section 154 and coupled to the control means 122, is a storage means 120. Storage means 120 can be an external memory device such as external ROM, etc., or can be internal to the microcontroller 122. Appropriate control software is also stored in storage means 120.

As part of the present invention, crystal 104 is tested and graded and the crystal information is stored in storage means 120. Preferably, the crystal operating characteristics are determined at least on a per degree Celsius scale or better. For example, the resonant frequency of crystal 104 is determined on a per degree Celsius change over a predetermined operating temperature range (e.g., −20 to +60 degree Celsius). Thereby, compensating for shifts in frequency of crystal 104 due to variations in temperature.

This shift in frequency of crystal 104 over temperature is translated to phase increment information that is stored in memory 120. This phase increment information (values) is the required phase increment value for generating a predetermined output signal 130 given a predetermined system clock signal (reference oscillator signal) 112. In operation, the system clock frequency 112 must be at least twice the generated frequency in order to meet the Nyquist rate criteria.

Given that the output signal 130 is a predetermined frequency (e.g., 864 KHz) and the system clock frequency is also known (e.g., 16.8 MHz), compensation for shifts in the system clock signal (reference oscillator signal) 112 can be done by providing a different phase increment value (compensation signal) to the digital synthesizer 148 in order to maintain the output signal frequency 130 substantially constant over changes in ambient temperature which affect the crystal 104. Since the crystal 104 has been characterized over temperature, the appropriate phase increment values are inputted to the phase increment means 114 in order for the digital synthesizer 148 to generate an output signal 130 having a substantially constant frequency over a given temperature range which affects the frequency of the system clock signal.

The value stored in the phase increment register 114 is added to the phase accumulator once during each clock cycle (system clock signal 112, preferably at the positive clock edge). The value sent to the phase increment register by control means 122 (on a per clock cycle basis) is dependent on the ambient temperature experienced by crystal 104, as determined by temperature sensing means 124 which is coupled to control means 122 and is part of compensation section 154. Temperature sensing circuit 124 can be a conventional diode configuration which generates a temperature signal 150 in accordance with the ambient temperature.

The phase increment value to be stored in phase increment register 114 is determined by control means 122 once the crystal operating temperature is measured by temperature sensor 124, at which point the corresponding phase increment value is recovered from memory 120 and sent to phase increment register 114. For example, if the temperature sensed by temperature sensing means 124 is determined to be 27 degrees Celsius, the phase increment value for this temperature is recovered from memory 120 and sent to phase increment register 114 as compensation signal 152. The manner of calculating the phase increment value will be discussed later in the description.

At every system clock cycle, the value stored in the phase increment register 114 is sent to a phase accumulator means such as phase accumulator 116 where the phase increments are summed. The output of the phase accumulator 116 which is the instantaneous phase value is in turn converted into a sine amplitude by the sine look-up table 118. The amplitude bit stream is then converted into an analog signal by the digital to analog converter (DAC) 126. The converted signal not only contains the desired sine wave as its major component, but also includes the higher frequency image components due to the conversion of a sampled waveform. In order to reduce the image signals to a desirable level, a low pass filter 128 is added. The low pass corner frequency of filter 128 must be equal to or less than half the sampled-frequency. Once a complete sine wave is generated (DDS generated signal 130) the phase accumulator is cleared (reset) and the process begins again in order to generate the next sine wave which forms the temperature compensated output signal 130.

The DDS generated signal 130 which has been temperature compensated can then be utilized as the reference oscillator signal in a conventional PLL synthesizer 144. The PLL circuit 144 comprises: a phase detector 132, charge pumps 134, divider circuit 140, loop filter (Fs) 136 and VCO 138, as known in the art and which provide the PLL output signal 142. The PLL output signal 142 can then be coupled to transmitter and receiver circuits (shown in FIG. 2) in order to form a radio. The reference signal 130 into the phase detector 132 may be squared off using a comparator in order to avoid jitter if required, depending on the application.

A typical example using the present invention yields the following:

$$F_G = \frac{F_S (\Delta\phi)}{2^N}$$

where, $F_G$ = Generated Frequency
$F_S$ = Clock Frequency
$\Delta\phi$ = Phase Increment Value
N = number of bits in phase accumulator Assuming a 16.8 MHz reference crystal 104 as the system clock for the DDS/PLL synthesizer circuit 100, and phase accumulator 116 and phase increment register 114 being 32-bit devices and also wanting to generate a 864 Khz signal 130. We can calculate the required phase increment value as follows:

$$\Delta\phi = \frac{2^N F_G}{F_S} = \frac{2^{32}(864 \times 10^3)}{16.8 \times 10^6}$$

$\Delta\phi = 220884032.4$ to generate 864 KHz.

Given that $F_G$ is known, a corresponding phase increment value on a per degree Celsius (or higher resolution basis, e.g., every 0.1 degree Celsius) is stored in memory 120, in order to have a substantially constant $F_G$. Since $F_S$ (system clock frequency 112) varies with temperature due to the crystal's frequency variation over temperature, the above calculation is performed for all measured temperature reference points in the relevant temperature range, thereby memory 120 has stored a look-up table with different phase increment values corresponding to different temperatures for oscillator circuit 146. The ambient temperature is measured as close as possible to crystal 104 and a compensation signal 152 is sent to phase increment register 114 every clock cycle of system clock signal 112.

In practice the fractional value (0.4) of $\Delta\phi$ is eliminated from the above result giving an $F_G$ of:

$$F_G = \frac{\Delta\phi F_S}{2^N} = \frac{220884032(16.8 \times 10^6)}{2^{32}}$$

$F_G = 863,999.9988$ Hz.

The frequency resolution is then calculated as follows:

$$\text{Frequency resolution} = \frac{F_S}{2^N}$$

$$\text{Resolution} = \frac{16.8 \times 10^6}{2^{32}} = 0.003911555 \text{ Hz}.$$

This can, in turn, be calculated in terms of parts-per-million (PPM) at 864 KHz as follows:

$$\frac{0.003911555}{0.864} = 0.004527263 \text{ PPM change for every bit}$$

increment in phase. The larger the number of bits in the phase increment register 114, the better the resolution of the output signal. The limiting factor for the temperature compensating circuit will probably lie in the temperature sensing sensor 124 and how accurately and quickly it can detect changes in temperature. As the clock frequency increases, the temperature sensor must be able to sense temperature changes faster unless the phase increment (compensation signal 152) updates are not sent on a per clock cycle basis (e.g, every two clock cycles, etc.).

By incrementing $\Delta \phi$ by one, the delta change in $F_G$ that takes place can be seen.

$$F_G = \frac{220884033(16.8 \text{ MHz})}{2^{32}}$$

$$F_G = 864{,}000.0027 \text{ Hz}$$

$$\Delta = 0.0039 \text{ Hz delta change.}$$

As been shown by the above calculations, by utilizing the present invention very low crystal resolutions can be obtained (0.0039 Hz in the above example). The reference frequency range is from 0.0039 Hz to 50% of the clock frequency (in this example 0.0039 Hz to 8.4 MHz), therefore it is possible to use a wider range of crystal elements as crystal element 104 as long as the element has been characterized as the resonant element 104 as previously described. The present invention also allows for a low-cost crystal having a bad over-temperature characteristics to be used given that once the crystal has been characterized over temperature, the digital synthesizer 148 provides for extremely high frequency resolution for output signal 130, as been shown.

Preferably, crystal 104 should be a high frequency crystal in order for different output signals 130 to be allowed to be generated. The present invention allows for different output signals frequencies to be generated once the crystals frequency behavior over temperature has been converted into appropriate phase increment values over temperature. Memory 120 can store different sets of phase increment values for different output signal frequencies which may be desired. Another technique could allow for microcontroller 122 to calculate the required phase increments in order to produce a given output signal using a characterization table of changes in clock signal frequency 112 due to changes in temperature affecting crystal 104. Thereby, only the changes in frequency of crystal 104 over temperature would have to be stored in memory 120. Phase increment values for different output signals having different frequencies in this case would not have to be pre-stored in memory 120, allowing for more system flexibility and less costlier memory devices. As shown in the synthesizer circuit schematic of FIG. 1, no varactor is required as the oscillator circuit's tuning vehicle.

Figure 2:
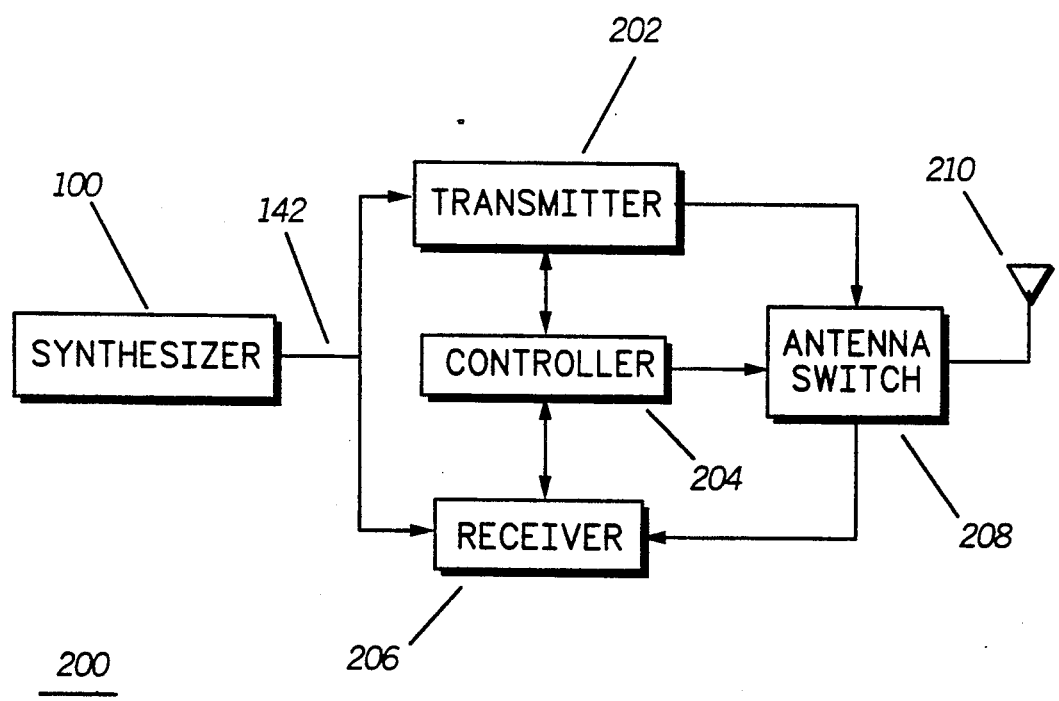
FIG. 2 is a block diagram of a radio in accordance with the present invention.

In FIG. 2, there is shown a block diagram of a radio 200 in accordance with the present invention. Block 100 is the DDS/PLL (phase-lock-loop) synthesizer with temperature compensation crystal circuitry described in FIG. 1. The PLL output signal 142 of circuit 100 is coupled to a conventional transmitter 202 and receiver 206 as known in the art. Radio 200 is controlled by a controller 204 such as a microprocessor or microcontroller as known in the art. Controller 204 provides control for both transmitter 202 and receiver 206. An antenna switch 208 under the control of controller 204 selectively couples the transmitter 202 and receiver 206 to antenna 210. Antenna switch 208 can be a duplexer or circulator, depending on the radio application at hand. Radio 200 can be a radio frequency (RF) two-way radio such as a time division multiplexed (TDM) radio.

As can be seen from the above discussion, the present invention provides for very tight frequency tolerances using very low cost crystals which can exhibit poor temperature characteristics. The invention also allows for the elimination of the varactor as the tuning element for the oscillator circuit of the PLL synthesizer. By using one high frequency crystal reference 104, a very wide range reference signal 130 can be generated by the DDS temperature compensation circuit disclosed in the present invention.

What is claimed is:

1. A method for temperature compensating a crystal oscillator circuit which provides a reference signal to a digital synthesizer, the digital synthesizer providing an output signal having a predetermined frequency that is substantially constant over changes in temperature, comprising the steps of:
    determining the temperature of the crystal oscillator circuit;
    selecting a phase increment value corresponding to the temperature that has been determined and the predetermined frequency of the output signal; and
    providing the selected phase increment value to the digital synthesizer in order for the digital synthesizer to use the phase increment value in generating the output signal at substantially the predetermined frequency.

2. The method for temperature compensating the crystal oscillator circuit of claim 1, comprising the further steps of:
    characterizing the crystal oscillator circuit over temperature in order to determine the crystal oscillator's change in reference signal frequency over a given temperature range;
    calculating phase increment values for generating the output signal at different temperatures in the temperature range given the crystal oscillator circuit's change in reference signal frequency over the given temperature range; and
    storing the phase increment values in a storage means.

3. The method for temperature compensating a crystal oscillator circuit of claim 2, wherein the step of selecting the phase increment value comprises comparing the determined temperature of the crystal oscillator to the phase increment values stored in the storage means and selecting the phase increment value corresponding to the determined temperature.

4. A temperature compensated circuit, comprising:
    a reference oscillator circuit for generating a reference oscillator signal;
    a synthesizer means for receiving the reference oscillator signal and for providing an output signal having a predetermined frequency; and
    a compensation means for determining the temperature of the reference oscillator circuit and for providing phase increment values to the synthesizer means in order for the synthesizer means to generate the output signal, the phase increment values are related to both the predetermined frequency of the output signal and the temperature of the reference oscillator circuit.

5. The temperature compensated circuit of claim 4, wherein the reference oscillator circuit comprises a crystal element having a predetermined resonant frequency range over a predetermined temperature range.

6. The temperature compensated circuit of claim 5, wherein the compensation means comprises:
   a storage means for storing the phase increment values corresponding to said predetermined resonant frequency range;
   a temperature sensing means for sensing the operating temperature of the crystal element and providing a corresponding temperature signal; and
   a control means coupled to the temperature sensing means for providing a phase increment value to the synthesizer means corresponding to the temperature signal received from the temperature sensing means.

7. A circuit for providing a temperature compensated output signal, comprising:
   a resonant circuit having a predetermined resonant frequency range over a predetermined temperature range, the resonant circuit providing a reference signal having a frequency that varies over the predetermined temperature range;
   a temperature sensing means for determining the temperature of the resonant circuit;
   a control means coupled to the temperature sensing means for providing a phase increment value related to the temperature of the resonant circuit; and
   a digital synthesizer means responsive to the reference signal and to the phase increment value for generating an output signal having a predetermined frequency.

8. The circuit of claim 7, wherein the resonant circuit comprises a crystal element.

9. The circuit of claim 7, wherein the digital synthesizer means comprises a phase increment means for storing the phase increment values from the control means.

10. The circuit of claim 9, wherein a new phase increment value is loaded into the phase increment means for each frequency cycle of the resonant circuit and the previous phase increment value stored in the phase increment means is sent to a phase accumulator means for accumulating the sum of successive phase increment values.

11. A synthesizer, comprising:
    a temperature compensated circuit, comprising:
    a reference oscillator circuit for generating a reference oscillator signal;
    a digital synthesizer means for receiving the reference oscillator signal and providing an output signal having a predetermined frequency; and
    a compensation means for determining the temperature of the reference oscillator circuit and for providing phase increment values which are related to both the temperature of the reference oscillator circuit and the frequency of the output signal to the digital synthesizer means in order for the digital synthesizer means to generate the output signal substantially at the predetermined frequency; and
    a phase locked loop synthesizer section responsive to the output signal for providing a phase locked loop output signal.

12. The synthesizer of claim 11, wherein the reference oscillator circuit comprises a crystal element having a predetermined resonant frequency range over a predetermined temperature range.

13. The synthesizer of claim 12, wherein the compensation means comprises:
    a storage means for permanently storing phase increment values corresponding to said predetermined resonant frequency range;
    a temperature sensing means for sensing the operating temperature of the crystal element and providing a corresponding temperature signal to a control means; and
    said control means coupled to the temperature sensing means for providing a phase increment value to the digital synthesizer means corresponding to the temperature signal received.

14. A radio, comprising:
    a receiver; and
    a synthesizer circuit, comprising:
    a temperature compensated circuit, comprising:
    a reference oscillator circuit for generating a reference oscillator signal;
    a digital synthesizer means for receiving the reference oscillator signal and providing an output signal having a predetermined frequency; and
    a compensation means for determining the temperature of the reference oscillator circuit and for providing phase increment values which are related to both the temperature of the reference oscillator circuit and the frequency of the output signal to the digital synthesizer means in order for the digital synthesizer means to generate the output signal substantially at the predetermined frequency, the receiver being responsive to the output signal.

15. The radio of claim 14, wherein the reference oscillator circuit comprises a crystal element.

* * * * *